(12) United States Patent  (10) Patent No.: US 6,556,018 B2
Benton  (45) Date of Patent: Apr. 29, 2003

(54) METHOD OF LOCATING DEFECTIVE SOCKETS IN A LIGHT STRAND

(76) Inventor: Virgil Benton, 1772 La Jolla Rancho Rd., La Jolla, CA (US) 92037

( * ) Notice: Subject to any disclaimer, the term of this patent is extended or adjusted under 35 U.S.C. 154(b) by 0 days.

(21) Appl. No.: 09/865,385

(22) Filed: May 25, 2001

(65) Prior Publication Data

US 2002/0175666 A1 Nov. 28, 2002

(51) Int. Cl.$^7$ .................... G01R 31/00; G01R 31/08; G01R 31/02; H05B 37/03
(52) U.S. Cl. .................... 324/414; 324/529; 324/72.5; 315/185 S
(58) Field of Search .................... 324/72.5, 133, 324/149, 414, 508, 509, 556, 529, 530, 507, 550; 315/122, 185 S

(56) References Cited

U.S. PATENT DOCUMENTS

| | | |
|---|---|---|
| 3,919,631 A | 11/1975 | Brown |
| 4,006,409 A | 2/1977 | Adams |
| 4,533,864 A | 8/1985 | Austin |
| 4,724,382 A | 2/1988 | Schauerte |
| 5,103,165 A | 4/1992 | Sirattz |
| 5,227,984 A | 7/1993 | Meldrum et al. |
| 5,539,317 A * | 7/1996 | Janning .................... 324/414 |
| 6,084,357 A * | 7/2000 | Janning .................... 315/122 |
| 6,259,257 B1 * | 7/2001 | Hawkins, Sr. .................... 324/133 |

* cited by examiner

*Primary Examiner*—Christine Oda
*Assistant Examiner*—James Kerveros
(74) *Attorney, Agent, or Firm*—Stetina Brunda Garred & Brucker

(57) ABSTRACT

A method of locating a defective bulb or socket in a light strand. The method includes connecting an electric power connector interface plug to exhibit an electro magnetic field thereat for checking its wires for operability of a fuse situated in the interface plug, and traversing an electro magnetic field detector along the non-illuminated bulb/sockets starting with the first non-illuminated bulb/socket closest to the interface and continuing in succession down the light strand until a non-illuminated bulb/socket is located that exhibits an electro magnetic field detection test opposite than that of the previous electro magnetic field detection test. Thereby identifying the non-illuminated bulb and/or socket with an electro magnetic field which is directly adjacent to a non-illuminated bulb and/or bulb socket that has no electro magnetic field as defective. If only this bulb is defective, its replacement will illuminate all bulbs in its circuit. If no illumination occurs, the above regimen is repeated until two non-illuminated sockets having opposite electro magnetic field detection tests directly adjacent to one another are detected. Once again, the non-illuminated bulb and/or socket testing positive (having an electro magnetic field) that is directly adjacent to the non-illuminated bulb/socket testing negative (having no electro magnetic field) is the defective bulb/socket. Repeating the above steps as necessary as indicated by non-illumination of bulbs will quickly locate repair and/or replacement sites.

7 Claims, 2 Drawing Sheets

METHOD OF LOCATING DEFECTIVE SOCKETS IN A LIGHT STRAND

CROSS REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates in general to circuit testing, and in particular to a method for locating a defective bulb or bulb socket in a strand of electric lights such as decorative Christmas and ornamental commercial lights connected in series and typically circuit sets containing 50 lights on one circuit. If one bulb is missing or does not make connection the 50 lights in its circuit will go out. Electro magnetic field detection tests (E.M.F.D.T.) are performed at two spaced non-illuminated bulb or bulb socket locations and are compared to determine alike or unlike test results. If no bulb or bulb socket defect resides between the two locations the respective test results will be identical. If the E.M.F.D.T.'s are unlike or opposite, meaning one test exhibits an electro magnetic field and the other test does not exhibit an electro magnetic field then a defective bulb or socket does exist between the two tests exhibiting opposite test results. The defective bulb or bulb socket is thereafter precisely identified by process of elimination until the non-illuminated bulb or socket testing positive (having a electro magnetic field) is directly adjacent to the non-illuminated bulb/socket testing negative (no electro magnetic field) is located.

It is not uncommon that at least one strand of decorative lights such.as those used during the Christmas season time to decorate Christmas trees, houses, shrubbery, and the like suffers from a defective bulb and/or bulb socket that causes outages of other bulbs where all of the sockets are wired in series and typically circuit sets containing 50-lights on one circuit. Consequently, if one bulb is missing, broken or does not make contact then the 49 other lights on its circuit will also go out, or if the strand is only a 50-light-strand, which is common, then the entire strand of lights will be out as a result of one defective bulb. Because of this electrical relationship of the sockets, it many times is extremely difficult, and usually very time-consuming, to find the exact location of a defective bulb or bulb socket. This is especially true where an affected strand is one of many used to produce specialty-type lighting collections such as the popular icicle-type lighting used for roof eave decoration to simulate icicles hanging from the roof's edge, and the "net" type lights used for decorating outdoor shrubs, hedges, etc. Depending upon the patience as well as the economic status of a user, it is not uncommon for entire lighting sets to be discarded and replaced with new and freshly packed bulbs for immediate and easy application. However, even such new strands can be defective or easily damaged during their installation.

In view of the above-exemplified untoward frustration that can occur while working with strand collections of lights, it is apparent that a need is present for efficient and easily-achieved methodology for testing inoperative strand portions and thereafter rapidly finding the exact location where a repair or replacement is needed. Accordingly, a primary object of the present invention is to provide a method of locating a defective bulb or bulb socket in a strand thereof by comparing electro magnetic field detection tests (E.M.F.D.T.) of spaced non-illuminated bulb sockets until a test change between two non-illuminated bulb/sockets occurs. Thereafter performing E.M.F.D.T.(s) at each socket between the two non-illuminated bulb/sockets exhibiting opposite test results until the non-illuminated bulb or socket testing positive (having an electro magnetic field) is directly adjacent to the non-illuminated bulb/socket testing negative (having no electro magnetic field) is located, this is the defective bulb/socket.

Another object of the present invention is to provide an easily usable test and repair kit for locating and correcting defective bulb or bulb sockets.

This and other objects of the present invention will become apparent throughout the description thereof which now follows.

BRIEF SUMMARY OF THE INVENTION

The present invention is a method of locating a defective bulb or bulb socket in a strand of electrically powered lights each within a respective bulb socket all connected in series and typically circuit sets containing 50 bulbs on one circuit wherein the strand has a power connector interface plug for connection to an electric power source. The method first includes connecting the power connector interface plug to an electric power source for providing power availability to the light strand. The connector interface, typically a standard-electrical plug, is connected to a wall socket or extension cord, the connector interface wires are then tested to determine the presence of an electro magnetic field, both for subsequent socket testing as described later and for checking operability of a fuse situated in the connector interface plug in that, if no magnetic field is present, an operator immediately knows that the fuse must be replaced (assuming the power source is operative and active). Next, an electro magnetic field detector is used to test the first non-illuminated light closest to the connector interface (referred to as light 1), this is called an Electro Magnetic Field Detection Test (E.M.F.D.T.) The operator reads the result of this first E.M.F.D.T. If the detector senses an electro magnetic field, depending upon the particular probe detector used, the tip of the detector will either glow and/or emit an audible beeping sound, this is called a positive or "Hot" test. Next, the electro magnetic field detector is successively traversed along non-illuminated sockets 2, 3, etc., and continuing downwards from the first E.M.F.D.T. until a non-illuminated socket is located that exhibits a E.M.F.D.T. opposite to that of the previous E.M.F.D.T. When this occurs, the non-illuminated bulb and/or socket that shows a positive test (having an electro magnetic field) and is directly adjacent to the non-illuminated bulb/socket showing a negative test (having no electro magnetic field) is recognized as the defective bulb or socket. If only the bulb is defective, its replacement should result in illumination of all bulbs on that circuit. If such illumination does not occur after replacement and it is determined that the socket is not defective, the above-described testing regimen is repeated. The second testing procedure begins from the newly replaced (but still non-illuminated) bulb continuing to the next non-illuminated socket down the light strand until the non-illuminated bulb/socket is located that exhibits an E.M.F.D.T. change from that of the newly replaced non-illuminated bulb. Once again, the non-illuminated socket that shows a positive test (having an electro magnetic field) that is directly adjacent to the non-illuminated socket showing a negative test (having no electro magnetic field) is recognized as the defective bulb, or socket. Repeating the above steps as necessary as indicated by non-illumination of bulbs will quickly locate repair and/or replacement sites within a strand and permit the operator to immediately address needed correction.

BRIEF DESCRIPTION OF THE DRAWINGS

An illustrative and presently preferred embodiment of the invention is shown in the accompanying drawings in which.

DETAILED DESCRIPTION OF PREFERRED EMBODIMENTS

Figure 1:
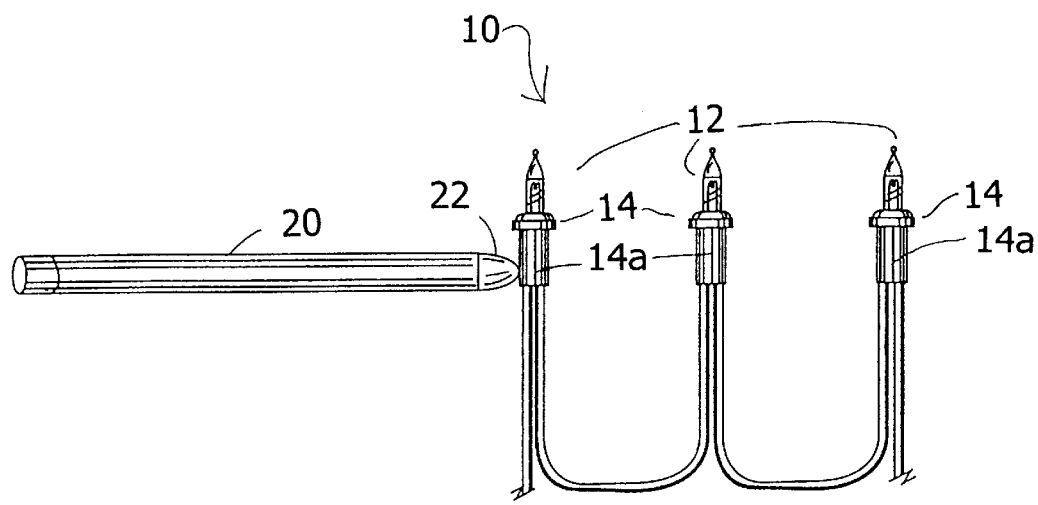
FIG. 1 is a side elevation view of a partial strand of decorative lights wired in series with a magnetic field detector in contract with one bulb socket.

Referring first to FIG. 1, a partial strand 10 of lights 12 such as those used in decorative Christmas lighting and in other decorative settings is shown. The strand 10 here shown illustrates three identical bulb or bulb socket combinations 14 each having a respective bulb socket 14a. Shown in contact with one socket 14a is a conventional electro magnetic field detection probe 20 which is a hand held, battery powered probe having a glow bulb indicator and sound beeper 22 that illuminates and sounds a beep when an electro magnetic field is detected. A non-limiting example of such a typical probe is that described in U.S. Pat. No. 5,103,165, incorporated herein by reference in its entirety. It is to be noted that the bulb indicator can be positioned other than at the terminus of the probe, and that magnetic field detection can be achieved without actually touching a socket 14a, but by merely placing the probe 20 in an acceptable proximity with such sockets.

Figure 2:
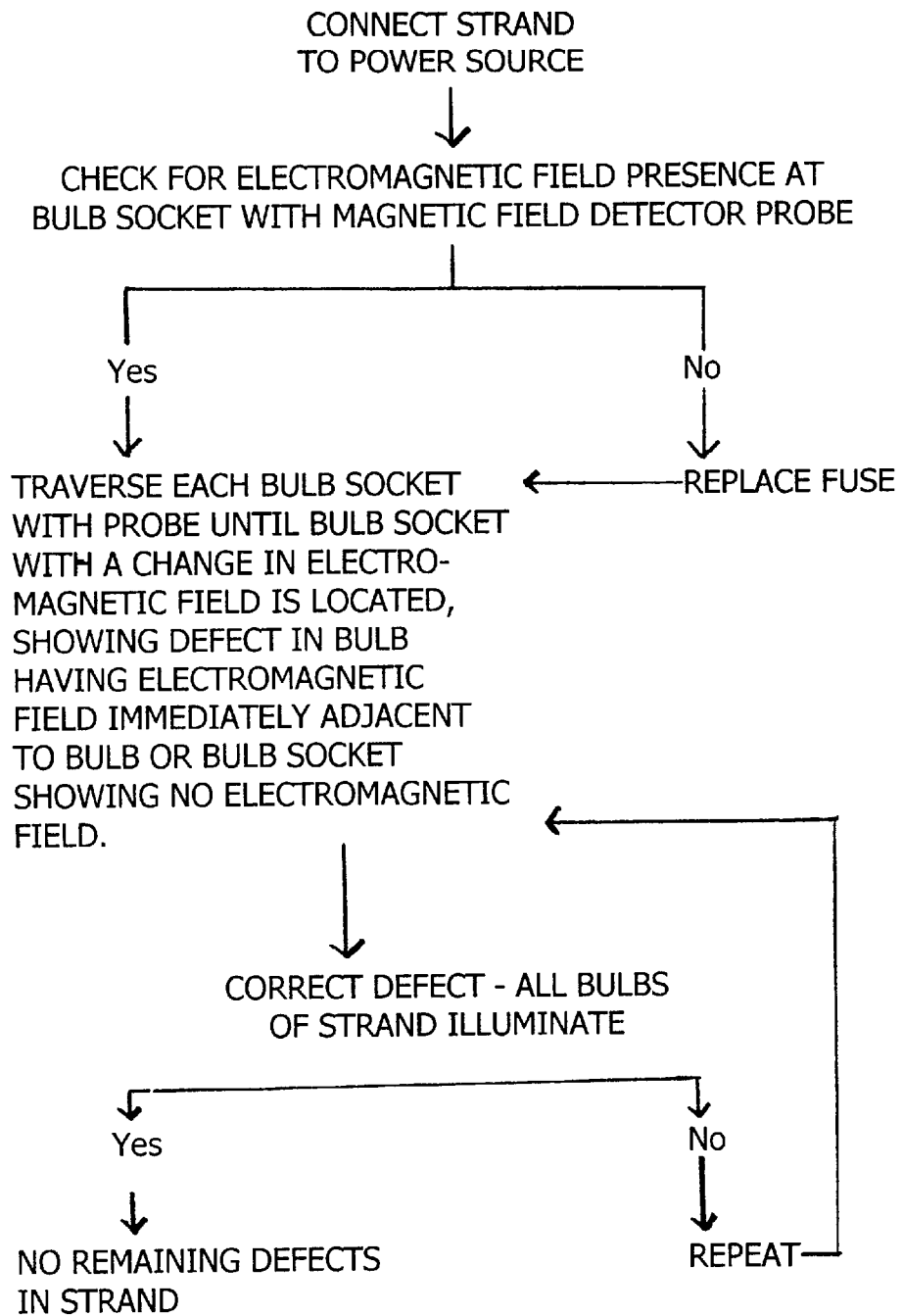
FIG. 2 is a flow chart illustrating methodology for locating a defective bulb or bulb socket in a strand of lights wired in series.

FIG. 2 illustrates methodology for locating a defective bulb or bulb socket in a strand of electrically powered lights each within a respective bulb socket where the sockets are connected in series. The strand typically has a standard 110V plug as a power connector interface for insertion into a standard wall socket or extension cord. Once the strand is so powered, the plug wires are tested via the field detection probe 20 to find an electro magnetic-field presence. If no such presence is detected, then the operator should verify that their power source is operative and active. After verifying the power source is active and no electro magnetic field is detected, the operator knows that a fuse(s) located within the plug is/(are) defective and must be replaced. Assuming the fuse is operable, the operator begins electro magnetic field detection tests (E.M.F.D.T.) starting at the first non-illuminated bulb (light 1). Next, they traverse each socket 14a in sequence with the probe 20, downwards from the first (E.M.F.D.T), meaning lights 2,3, etc., until a non-illuminated socket is located that exhibits an opposite test result to the previous E.M.F.D.T. When this occurs, the non-illuminated bulb and/or socket that shows a positive test (having an electro magnetic field) that is directly adjacent to the non-illuminated bulb/socket showing a negative test (having no electro magnetic field) is recognized as the defective bulb or socket. If only the bulb is defective, its replacement should result in illumination of all bulbs on that circuit. If such illumination does not occur after replacement and it is determined that the socket is not defective, the above-described testing regimen is repeated, starting at the newly replaced (but still non-illuminated) bulb and continuing to the next non-illuminated sockets in sequence down the strand until the non-illuminated bulb/socket is located that exhibits an opposite E.M.F.D.T. from that of the newly replaced non-illuminated bulb/socket. Once again, the non-illuminated bulb and/or socket that shows a positive test (having an electro magnetic field) that is directly adjacent to the non-illuminated bulb/socket showing a negative test (having no electro magnetic field) is recognized as the defective bulb or socket. Repeating the above steps as necessary, as indicated by non-illumination of bulbs, will quickly locate repair and/or replacement sites within a strand and permit the operator to immediately address needed correction.

Figure 3:
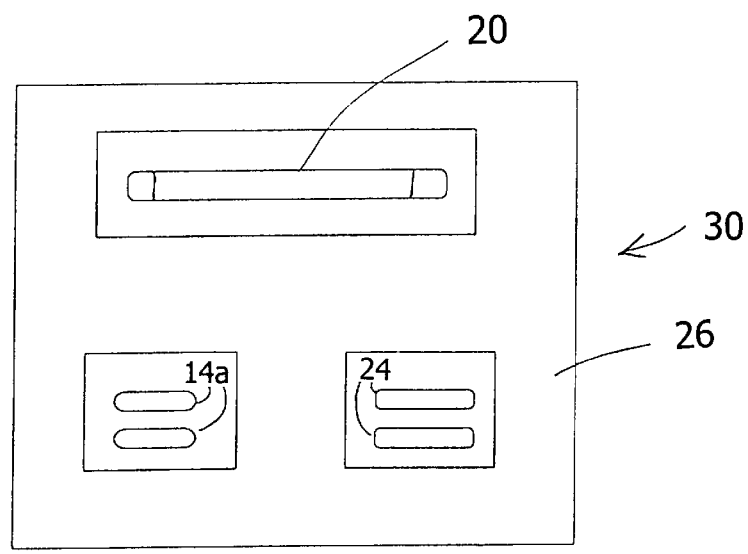
FIG. 3 is a top plan view of a test kit for locating and potentially rectifying a defective bulb or bulb socket in a strand of lights wired in series.

Also an embodiment of the present invention is a test-and-repair kit, as illustrated in FIG. 3, for locating and potentially rectifying a defective fuse and/or bulb in a strand of electrically powered lights each within a respective bulb socket all connected in series. The kit 30 includes a hand held, battery-powered, magnetic field detection probe 20, a quantity of replacement bulbs 14a, and a quantity of replacement fuses 24, all retained for storage and subsequent ready availability within a housing package 26. Testing instructions for the various types of light string configurations are also included in this kit.

As is apparent from the above description, the methodology here taught provides a highly productive and effectual approach for the solution of a problem that is widely experienced in a magnitude of settings. While illustrative and presently preferred embodiments of the invention have been described in detail herein, it must be understood that the inventive concepts may be otherwise variously embodied and employed and that the appended claims are intended to be construed to include such variations except insofar as limited by prior art.

What is claimed is:

1. A method of locating a defective bulb or bulb socket in a strand of electrically powered lights each within a respective bulb socket all connected in series, said strand having a standard 110 volt power connector interface plug, the method comprising:

a) connecting the power connector interface plug to an electric power source and in a connection that provides an electro magnetic field to said interface; and b) traversing the non-illuminated bulbs/sockets in sequence with an electro magnetic field detection probe starting from the non-illuminated bulb/socket closest to the power source until an electro magnetic field is detected, and locating the defective bulb/socket from which the electro magnetic field is detected by the electro magnetic field detection probe; and c) replacing the defective bulb/socket with a new bulb before traversing the non-illuminated bulb/socket following the defective bulb/socket.

2. A method of locating a defective bulb or bulb socket as claimed in claim 1 further comprising performing step (b) on the non-illuminated bulb/socket following the defective bulb/socket when the step of replacing the defective bulb/socket does not result in illumination of all said lights.

3. A method of locating a defective fuse, bulb or bulb socket in a strand of electrically powered lights each within a respective bulb socket all connected in series said strand having a fuse-bearing power connector interface, the method comprising:

a) connecting the power connector interface to an electric power source;

b) testing the interface plug wires with an electro magnetic-field protection probe for presence of an electro magnetic field thereat, and replacing the fuse when no electro magnetic field presence is detected (assuming the power source is operative and active);

c) upon establishing presence of the electro magnetic field at said interface plug wires, traversing in succession with the electro magnetic-field detection probe and starting from the first non-illuminated bulb/socket closest to the interface until the non-illuminated bulb/socket that exhibits a test result opposite to that of the previous non-illuminated bulb/socket thereof.

4. A method of locating a defective fuse, a bulb or bulb socket as claimed in claim 3 further comprising correcting the bulb/socket that exhibits the opposite test result before traversing the non-illuminated bulb/socket subsequent thereto.

5. A method of locating a defective fuse, a bulb or bulb socket as claimed in claim 4 further comprising performing step (c) of claim 3 on the non-illuminated bulb/socket subsequent to the non-illuminated bulb/socket that exhibits the opposite test when step (d) does not result in illumination of all said lights.

6. A test kit for locating and potentially rectifying a defective fuse, bulb or bulb socket in a strand of a plurality of electrically powered lights each within a respective bulb socket all connected in series, the test kit comprising:

a) a handheld, battery-powered magnetic-field detection probe, operative to test the fuse, the bulb and the bulb socket while being placed in proximity thereof;

b) at least one replacement bulb for the strand;

c) at least one replacement fuse for the strand;

d) a housing package for retaining said probe, bulbs, and fuses; and e) written instructions for use of said detection probe.

7. A test kit as claimed in claim 6, wherein the handheld, battery-powered magnetic-field detection probe is operative to test the fuse, the bulb and the bulb socket while being placed in proximity thereof.

* * * * *